US011101297B2

(12) United States Patent
Chen

(10) Patent No.: US 11,101,297 B2
(45) Date of Patent: Aug. 24, 2021

(54) DISPLAY DEVICE

(71) Applicant: AU Optronics Corporation, Hsin-Chu (TW)

(72) Inventor: Hung-Hsin Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 34 days.

(21) Appl. No.: 16/690,180

(22) Filed: Nov. 21, 2019

(65) Prior Publication Data

US 2020/0227442 A1    Jul. 16, 2020

(30) Foreign Application Priority Data

Jan. 14, 2019   (TW) ................. 108101405

(51) Int. Cl.
*H01L 27/12* (2006.01)
*H01L 23/498* (2006.01)
*G02F 1/1368* (2006.01)

(52) U.S. Cl.
CPC ...... *H01L 27/124* (2013.01); *H01L 23/49833* (2013.01); *G02F 1/1368* (2013.01)

(58) Field of Classification Search
CPC .................................................. H01L 27/124
See application file for complete search history.

(56) References Cited

U.S. PATENT DOCUMENTS

| 2008/0158467 | A1* | 7/2008 | Tseng | G02F 1/13452 349/58 |
| 2009/0194342 | A1* | 8/2009 | Kuo | H05K 1/118 178/18.03 |
| 2014/0009400 | A1* | 1/2014 | Poorter | G06F 3/041 345/173 |
| 2016/0306478 | A1 | 10/2016 | Lai et al. | |

FOREIGN PATENT DOCUMENTS

| CN | 109116643 A | 1/2019 |
| JP | 2000-111936 A | 4/2000 |

* cited by examiner

*Primary Examiner* — William A Harriston
(74) *Attorney, Agent, or Firm* — WPAT, PC

(57) ABSTRACT

A display device includes a first transparent substrate, a first circuit board, a second circuit board, and a thin film transistor (TFT) array. The first transparent substrate includes a body and a protruding portion which are connected to each other. The protruding portion has an outer surface facing away from the body. The first circuit board is adjacent to the protruding portion, and the first circuit board and the protruding portion are located on the same side of the body together. The first circuit board has an inner surface facing the body, and a vertical projection of the inner surface on the protruding portion is located between the outer surface and the body. The second circuit board is disposed on the protruding portion and extends to the first circuit board. The TFT array is disposed on the body.

12 Claims, 6 Drawing Sheets

DISPLAY DEVICE

RELATED APPLICATION

This application claims priority to Taiwan Application Serial Number 108101405, filed Jan. 14, 2019, which is herein incorporated by reference in its entirety.

BACKGROUND

Technical Field

The present disclosure relates to a display device.

Description of Related Art

Among various electronic products of home appliance devices, the display devices have been widely used to output images or operate menus. The display device includes a plurality of electronic components and wirings for connecting these electronic components. For example, in a display device with a thin film transistor array, the signals can be transmitted to the thin film transistor array through the wirings, so as to apply the voltage to the pixel electrodes connected to the thin film transistor. In response to the present trend of the consumer market, the related products of the display devices gradually tend to have high screen-to-body ratio. In this regard, the display devices with narrow bezel design have also been developed and are also strongly echoed by the consumer market. In the narrow bezel design, for the peripheral area of the display device outside the display area, how to effectively utilize the space of the peripheral area to complete the routing or component configuration has become one of the important topics in the related fields.

SUMMARY

One embodiment of the present disclosure is to provide a display device, which includes a first transparent substrate, a first circuit board, a second circuit board, and a thin film transistor array. The first transparent substrate includes a body and a protruding portion which are connected to each other. The protruding portion has an outer surface facing away from the body. The first circuit board is adjacent to the protruding portion, and the first circuit board and the protruding portion are together located on the same side of the body. The first circuit board has an inner surface facing the body, and a vertical projection of the inner surface on the protruding portion is located between the outer surface and the body. The second circuit board is disposed on the protruding portion and extends to the first circuit board. The thin film transistor array is disposed on the body.

In some embodiments, the display device further includes a conductive pattern. The conductive pattern is disposed on the first transparent substrate, in which the thin film transistor array is electrically connected to the first circuit board at least through the conductive pattern and the second circuit board.

In some embodiments, the protruding portion has a first side surface, the first circuit board has a second side surface, and the first side surface and the the second side surfaces face each other.

In some embodiments, the display device further includes a connector. The connector is disposed on a lower surface of the first circuit board, in which the lower surface of the first circuit board is located between the second circuit board and the connector.

In some embodiments, the display device further includes a backlight module. The first transparent substrate is disposed on the backlight module, the connector and the backlight module are together located on the same side of the first transparent substrate, and each of the connector and the backlight module has a surface facing each other.

In some embodiments, the protruding portion has a first upper surface, the first circuit board has a second upper surface, the first upper surface and the second upper surface face the second circuit board and are together located on the lower side of the second circuit board, and the position of the second upper surface is higher than the position of the first upper surface.

In some embodiments, the inner surface of the first circuit board is separated from the body by a gap.

In some embodiments, the display device further includes an integrated circuit component and a conductive pattern. The integrated circuit component is disposed on the protruding portion. The conductive pattern is disposed on the protruding portion and electrically connected to the integrated circuit component and the second circuit board, and the integrated circuit component is electrically connected to the thin film transistor array at least through the conductive pattern.

In some embodiments, the number of the protruding portions is at least two, and the first circuit board is located between the protruding portions.

In some embodiments, the display device further includes a plurality of integrated circuit components disposed on the protruding portions, respectively.

In some embodiments, the number of the first circuit boards is at least two, and the protruding portion is located between the first circuit boards.

In some embodiments, the display device further includes a conductive pattern. The conductive pattern is disposed on the first transparent substrate and electrically connected to the thin film transistor array, in which the conductive pattern is continuously extended from the body to the protruding portion, and the second circuit board contacts the conductive pattern.

In some embodiments, the display device further includes a second transparent substrate and a display medium layer. The second transparent substrate is disposed on the first transparent substrate. The display medium layer and the thin film transistor array are together disposed between the first transparent substrate and the second transparent substrate.

With the aforementioned configuration, since the first circuit board can be disposed on at least one side of the protruding portion, the arrangement relationship between the first circuit board and the first transparent substrate can be tighter so as to increase the screen-to-body ratio of the display device and facilitate designing the display device with narrow bezel. Furthermore, by directly disposing the first circuit board on one side of the protruding portion, it facilitates simplifying the structural complexity while disposing the circuit board. For example, the circuit board does not have to be folded back.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other words, in some embodiments of the present invention, these practical details are not necessary. Moreover, some well-known structures and devices are schematically depicted in order to simplify the drawings.

It will be understood that when an element is referred to as being "on" another element, it can be directly on the other element or intervening elements may be present therebetween. In contrast, when an element is referred to as being "directly on" another element, there are no intervening elements present. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The term "about" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" or "substantially" may mean within one or more standard deviations, or within, for example, ±30%, ±20%, ±15%, ±10%, ±5% of the stated value.

Figure 1A:
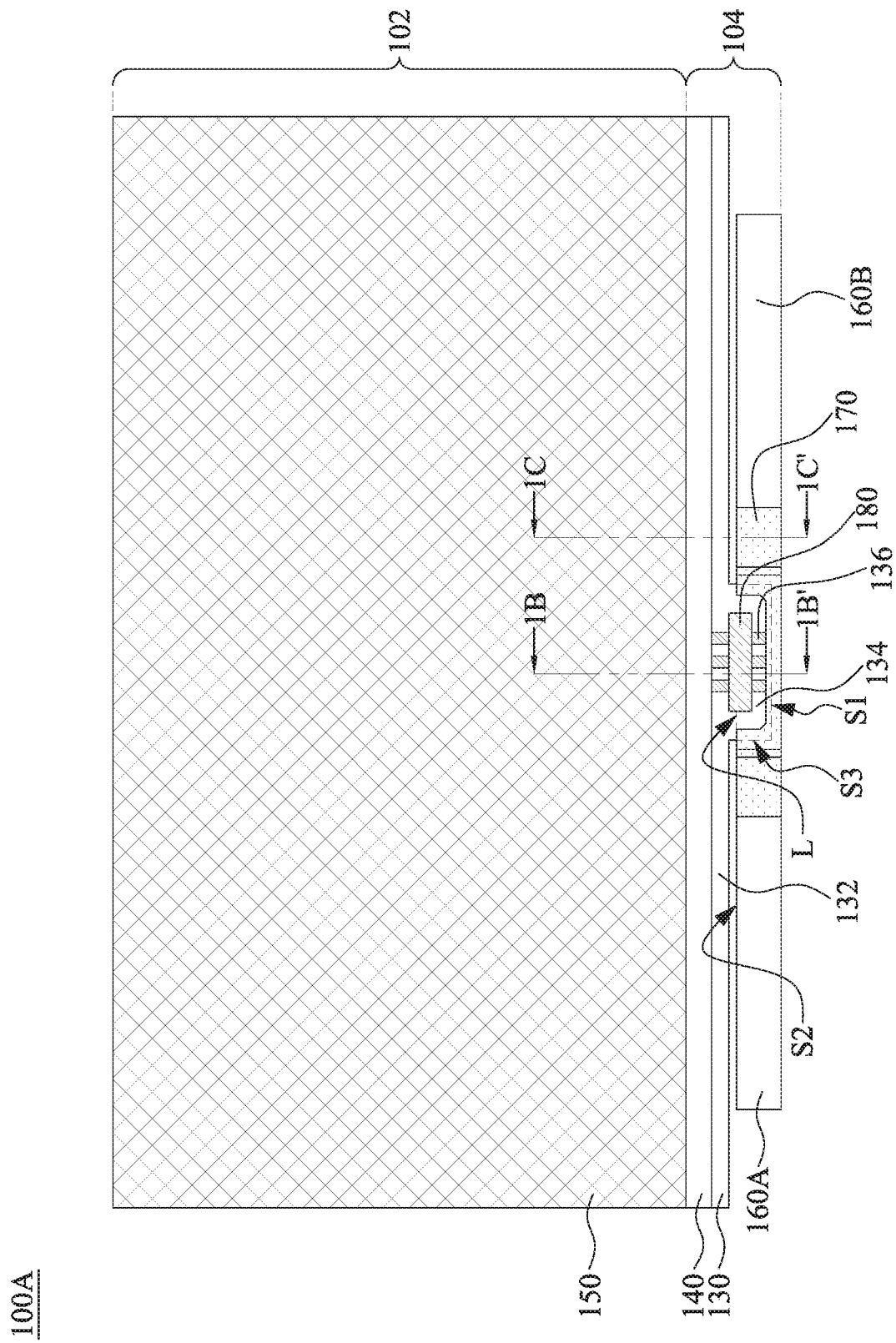
FIG. 1A illustrates a top view of a display device according to a first embodiment of the present disclosure.
Figure 1B:
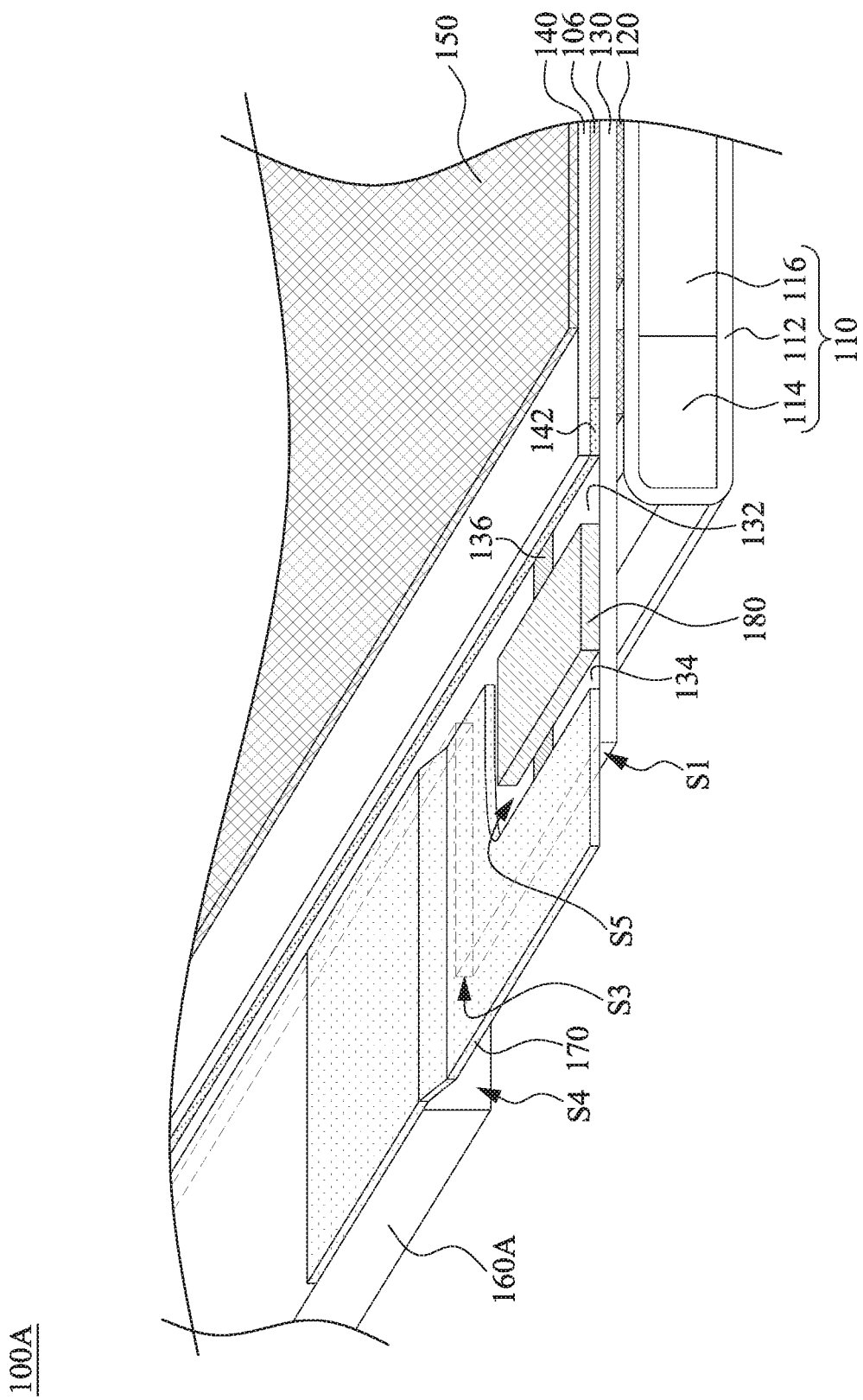
FIG. 1B illustrates a stereoscopic sectional view along the line segment 1B'-1B in FIG. 1A.

Reference is made to FIG. 1A and FIG. 1B. FIG. 1A illustrates a top view of a display device 100A according to a first embodiment of the present disclosure, and FIG. 1B illustrates a stereoscopic sectional view along the line segment 1B'-1B in FIG. 1A. The display device 100A includes a display area 102 and a peripheral area 104 which are connected to each other. In order to better understanding, the drawing ratio of partial area is enlarged. For example, in the present embodiment, the drawing ratio of the peripheral area 104 in FIG. 1A is enlarged. The display device 100A includes a backlight module 110, a first polarizer 120, a first transparent substrate 130, a conductive pattern 136, a second transparent substrate 140, a second polarizer 150, first circuit boards 160A and 160B, a second circuit board 170 and an integrated circuit component 180.

The first transparent substrate 130 and the second transparent substrate 140 may be glass substrates and assembled via an adhesive layer 142. The adhesive layer 142 may be a sealant. A layer body 106 may be disposed between the first transparent substrate 130 and the second transparent substrate 140, and the layer body 106 may be a composite-layer body (herein is shown by a single-layer body in order to simplify the drawing). In some embodiments, the layer body 106 may include, for example, a thin film transistor array (which includes a plurality of thin film transistors), a wiring layer, a display medium layer (e.g., a liquid crystal layer), and a color filter layer.

The first transparent substrate 130 includes a body 132 and a protruding portion 134 which are connected to each other. The body 132 can be located on least in the display area 102 and the peripheral area 104, and the protruding portion 134 can be located in the peripheral area 104. A conductive pattern 136 can be disposed on the protruding portion 134, in which the conductive pattern 136 is electrically connected to the layer body 106, for example, electrically connected to the thin film transistor array or the wiring layer between the first transparent substrate 130 and the second transparent substrate 140. The conductive pattern 136 may be a conductive material formed on the first transparent substrate 130 for use as a wiring, which includes a metallic material, a non-metallic material, or a combination thereof.

The protruding portion 134 can be formed by cutting the first transparent substrate 130. For example, the first transparent substrate 130 may be rectangular before being cut. In other words, before the cutting, there is a part of the first transparent substrate being connected to the left and right sides of the protruding portion 134 (e.g., the left and right sides of the protruding portion 134 in FIG. 1A). For the first transparent substrate 130, before the cutting, the protruding portion 134 can be designed as a area for arranging the conductive pattern 136, and the portions at left and right sides of the protruding portion 134 can be regarded as the redundant areas of the first transparent substrate 130. The cutting process can be performed to remove the redundant areas of the first transparent substrate 130 to form the first transparent substrate 130 as shown in FIG. 1A and FIG. 1B.

The integrated circuit component 180 may be disposed on the protruding portion 134 and electrically connected to the conductive pattern 136. The integrated circuit component 180 can be electrically connected to the layer body 106 through the conductive pattern 136 to transmit control signals or driving signals to the layer body 106. For example, the integrated circuit component 180 may be a control component or a driving component corresponding to the thin film transistor array between the first transparent substrate 130 and the second transparent substrate 140, and transmits the driving signals to the thin film transistor array.

The first circuit boards 160A and 160B and the second circuit board 170 are located in the peripheral area 104. The first circuit boards 160A and 160B are adjacent to the protruding portions 134 and are located on the same side of the body 132 in conjunction with the protruding portions 134. The protruding portions 134 can be located between the first circuit boards 160A and 160B. Taking FIG. 1A as an example, the first circuit boards 160A and 160B and the protruding portion 134 are together located at a lower side of the body 132. The second circuit board 170 is disposed above the protruding portion 134 and extends from the protruding portion 134 to the first circuit boards 160A and 160B, in which the protruding portion 134 and the first circuit boards 160A and 160B are together located on the same side of the second circuit board 170. Taking FIG. 1B as an example, the first circuit boards 160A and 160B and the protruding portion 134 are together located below the second circuit board 170. The thickness of the first circuit boards 160A and 160B may be greater than the thickness of the second circuit board 170. In some embodiments, the first circuit boards 160A, 160B may be printed circuit boards, and the second circuit board 170 mat be a flexible circuit board. In addition, the second circuit board 170 may be partially bent in the extended path of the second circuit board 170 which is extended from the protruding portion 134 to the first circuit boards 160A and 160B.

The second circuit board 170 can be electrically connected to the first circuit board 160A and 160B and the conductive pattern 136, in which the second circuit board 170 can be electrically connected to the integrated circuit component 180 through the conductive pattern 136 so that the integrated circuit component 180 can be further electrically connected to the first circuit boards 160A and 160B through the conductive pattern 136 and the second circuit board 170. In some embodiments, the integrated circuit component 180 can be connected to a power supply terminal or other digital/analog components through the first circuit boards 160A and 160B.

Since the redundant areas of the first transparent substrate 130 are cut off, the arrangement relationship between the first circuit boards 160A and 160B and the first transparent substrate 130 may be tighter. As a result, the screen-to-body ratio of the display device 100A is increased, and it facilitates designing the display device 100A with narrow bezel ("narrow bezel" herein can be regarded as a border width of about 5 millimeters). In other words, if the redundant areas of the first transparent substrate 130 were not cut off, the first circuit boards 160A and 160B fail to be disposed on the positions as shown in FIG. 1A, which results in increasing the peripheral area 104 of the display device and reducing the screen-to-body ratio of the display device 100A.

Further, the protruding portion 134 has an outer surface S1 (labeled in FIG. 1A and FIG. 1B), in which the outer surface S1 faces away from the body 132. The first circuit board 160A has an inner surface S2 (not shown in FIG. 1B in order to simplify the drawing), in which the inner surface S2 faces the body 132, and a vertical projection (the position thereof, for example, is shown by the broken line L in FIG. 1A) of the inner surface S2 on the protruding portion 134 is located between the outer surface S1 and the body 132. With this configuration, the spaces on the left and right sides of the protruding portion 134 can be effectively utilized to integrate the first circuit boards 160A and 160B on the left and right sides of the protruding portion 134. "Integrate the first circuit boards 160A and 160B on the left and right sides of the protruding portion 134" herein means that, for example, the protruding portion 134 overlaps the connection line between the first circuit boards 160A and 160B. For example, the protruding portion 134 may have a first side surface S3 (labeled in FIG. 1A and FIG. 1B), and the first circuit board 160A may have a second side surface S4 (not labeled in FIG. 1A in order to simplify the drawing), and the first side surface S3 and the second side surface S4 face to each other.

The first transparent substrate 130 is also disposed on the backlight module 110, and the first polarizer 120 is disposed between the backlight module 110 and the first transparent substrate 130. The second polarizer 150 is disposed on the second transparent substrate 140, such that the layer body 106 between the first transparent substrate 130 and the second transparent substrate 140 is located between the first polarizer 120 and the second polarizer 150. The backlight module 110 may include a frame 112, a light source 114, and a light guide plate 116, in which the light source 114 and the light guide plate 116 are located within the frame 112. The light source 114 can provide the light to the light guide plate 116, and the light guide plate 116 can guide the light to travel toward the first polarizer 120, so that the display device 100A can provide an image via the light passing through the first polarizer 120, the layer body 106 and the second polarizer 150.

Figure 1C:
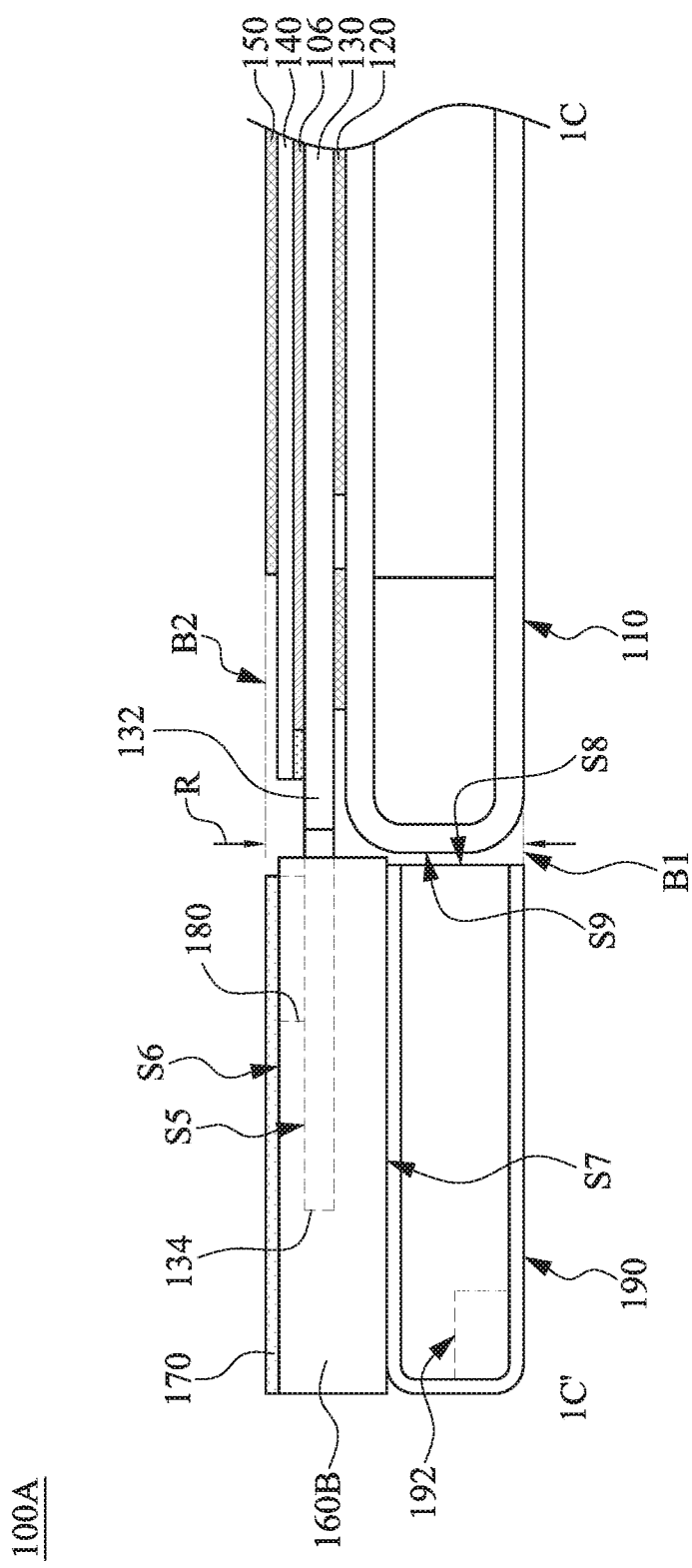
FIG. 1C illustrates a side sectional view along the line segment 1C'-1C in FIG. 1A.

Reference is made to FIG. 1B and FIG. 1C, in which FIG. 1C illustrates a side sectional view along the line segment 1C'-1C in FIG. 1A. The backlight module 110, the first polarizer 120, the first transparent substrate 130, the layer body 106, the second transparent substrate 140, and the second polarizer 150 together form a thickness range R, in which a lower boundary B1 and an upper boundary B2 of the thickness range R are defined by the lowermost edge of the backlight module 110 and the uppermost edge of the second polarizer 150, respectively. In some embodiments, the thickness range R may range from 1.5 millimeters to 2.0 millimeters.

In this regard, since the first circuit boards 160A and 160B can be directly disposed on the left and right sides of the protruding portion 134, it facilitates simplifying the structural complexity while disposing the circuit board. For example, since the first circuit boards 160A and 160B or the second circuit board 170 do not have to be folded back (which results that they exceed the boundary of the thickness range R), it facilitates thinning design for the display device 100A.

In addition, when disposing other components in the display device 100A, the disposed components can also prevent from exceeding the boundary of the thickness range R that causes an increase in the thickness of the display device 100A, as will be described below.

On the condition that the first circuit boards 160A and 160B are directly disposed on the left and right sides of the protruding portion 134, the area between the first circuit boards 160A and 160B and the lower boundary B1 of the thickness range R may be regarded as an accommodation space. In order to increase the capacity of the accommodation space, the first circuit boards 160A and 160B can be disposed higher than the first transparent substrate 130. For example, the protruding portion 134 and the first circuit board 160B may have a first upper surface S5 (labeled in FIG. 1B and FIG. 10) and a second upper surface S6 (labeled in FIG. 1C), respectively. The first upper surface S5 and the second upper surface S6 face the second circuit board 170 and are together located on the lower side of the second circuit board 170, and the position of the second upper surface S6 is higher than the position of the first upper surface S5 to increase the capacity of the accommodation space.

The accommodation space can be used to dispose, such as the components for connecting the display device 100A to an external device. For example, as shown in FIG. 10, the display device may further include a connector 190 disposed in the accommodation space, that is, the connector 190 is disposed under the first circuit board 160B (the connector is not shown in FIG. 1B in order to simplify FIG. 1B). Specifically, the first circuit board 160B may have a lower surface S7 opposite to the second upper surface S6, that is, the lower surface S7 faces away from the second circuit board 170. The connector 190 may be disposed on the lower surface S7 of the first circuit board 160B, such that the lower surface S7 of the first circuit board 160B is located between the second circuit board 170 and the connector 190. The connector 190 may have a connection terminal 192, in which the first circuit board 160B can be electrically connected to the connection terminal 192, so as to be connected to the external device through the connection terminal 192.

With the aforementioned configuration, the connector 190 can be disposed close to but not beyond the lower boundary B1 of the thickness range R (i.e., the connector 190 can at least partially overlap the extension surface of the lower surface of the backlight module 110) to prevent the display device from increasing the thickness of the display device 100A, so as to facilitate thinning design for the display device 100A. "The connector 190 can be disposed close to but not beyond the lower boundary B1 of the thickness range R" herein means that, for example, the connector 190 and the backlight module 110 can be together located on the same side of the first transparent substrate 130 (taking FIG. 10 as an example, i.e., the lower side of the first transparent substrate 130), and each of them has a surface (S8 and S9) facing each other. In some embodiments, the total thickness formed of the connector 190, the first circuit board 160B, and the second circuit board 170 may range from 1.5 millimeters to 2.0 millimeters.

Similarly, the second circuit board 170 can also be disposed close to but not beyond the upper boundary B2 of the thickness range R, i.e., the second circuit board 170 can be at least partially overlap the extension surface of the upper surface of the second polarizer 150. In addition, the second circuit board 170 can be attached on the protruding portions 134, the first circuit boards 160A and 160B by a bonding process. On the condition that the first circuit boards 160A and 160B or the second circuit board 170 does not have to be folded back, the bonding process for the second circuit board 170 can be simplified. In some embodiments, the inner surfaces S2 of the first circuit boards 160A and 160B may be separated from the body 132 by a gap, so that there is tolerance between the first circuit boards 160A and 160B and the body 132, thereby facilitating assembly.

Figure 2:
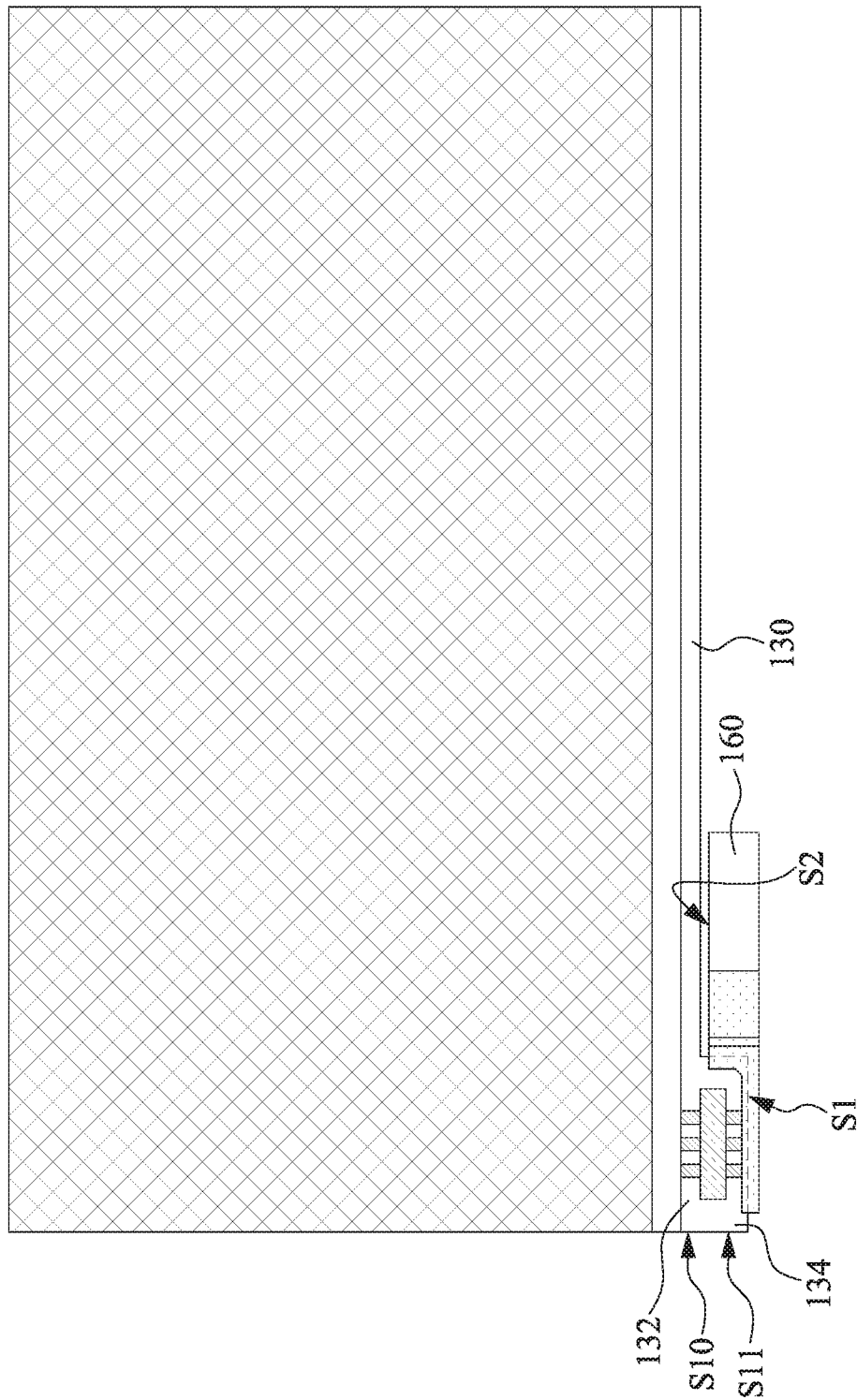
FIG. 2 illustrates a top view of a display device according to a second embodiment of the present disclosure.

Reference is made to FIG. 2. FIG. 2 illustrates a top view of a display device 100B according to a second embodiment of the present disclosure. At least one difference between the present embodiment and the first embodiment is that the number of the first circuit board 160 is one in the present embodiment. In addition, in the present embodiment, the position on which the protruding portion 134 is located is also changed to the boundary of the first transparent substrate 130, such that the side surface S10 of the body 132 and the side surface S11 of the protruding portion 134 are substantially coplanar.

Similarly, the vertical projection of the inner surface S2 of the first circuit board 160 on the protruding portion 134 is located between the outer surface S1 of the protruding portion 134 and the body 132 to achieve integrating the first circuit board 160 on one side of the protruding portion 134 (taking FIG. 2 as an example, i.e., the first circuit board 160 is integrated on the right side of the protruding portion 134), thereby simplifying the structural complexity while disposing the circuit board, and facilitating thinning design for the display device 100B. Moreover, by disposing the protruding portions 134 on the boundary of the first transparent substrate 130, it also facilitates disposing other components on the display device 100B. Taking FIG. 2 as an example, the right side of the protruding portion 134 and the first circuit board 160 can be further disposed with additional components, and the deposed components do not cause an increase in the size of the display device 100B so as to facilitate designing the display device 100B with narrow bezel.

Figure 3:
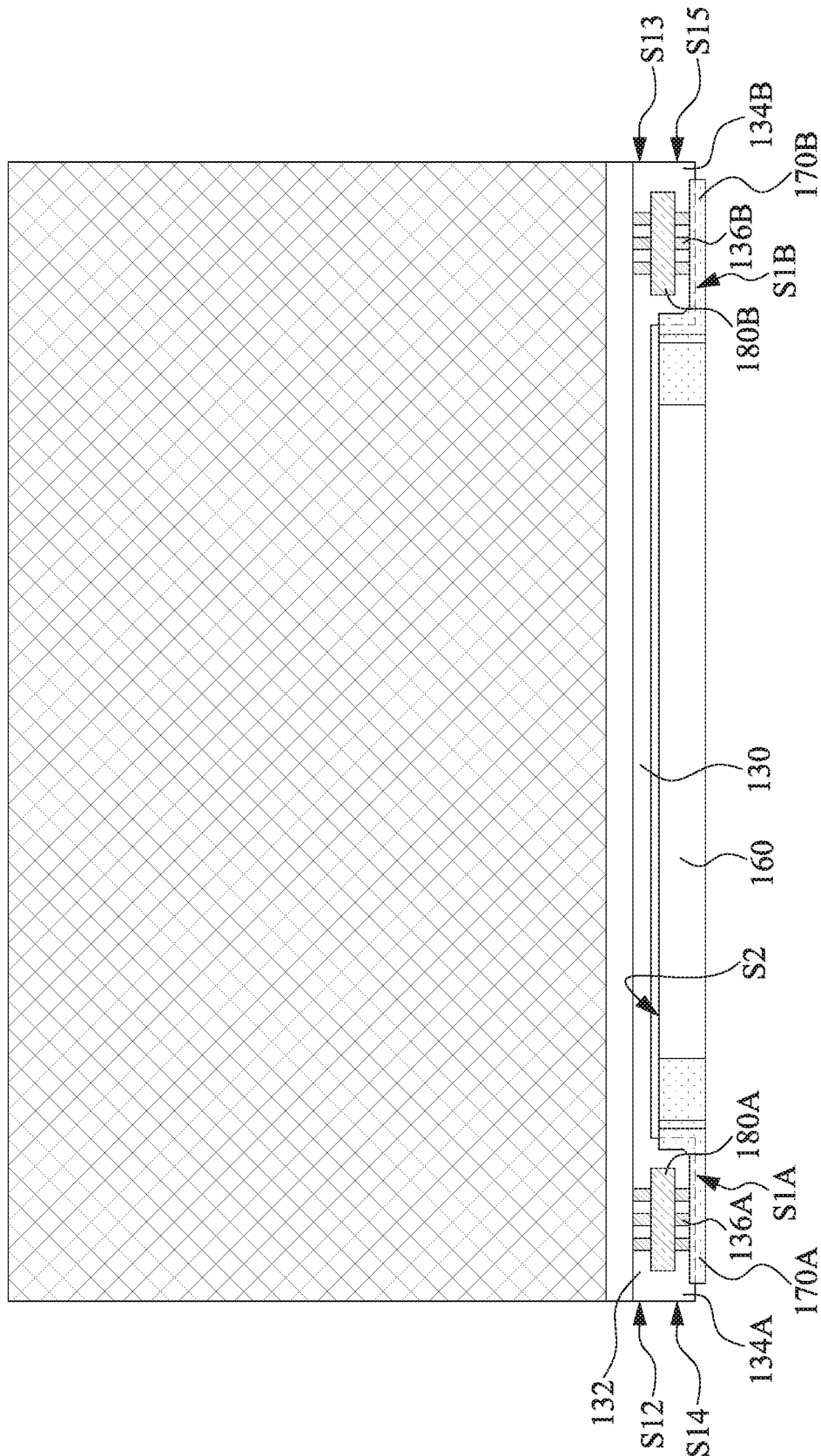
FIG. 3 illustrates a top view of a display device according to a third embodiment of the present disclosure.

Reference is made to FIG. 3. FIG. 3 illustrates a top view of a display device 100C according to a third embodiment of the present disclosure. At least one difference between the present embodiment and the first embodiment is that the number of the protruding portions 134A and 134B is two in the present embodiment. The protruding portions 134A and 134B are respectively located on two opposite boundaries of the first transparent substrate 130, such that the opposite side surfaces S12 and S13 of the body 132 are substantially coplanar with respect to the side surface S14 of the protruding portions 134A and the side surface S15 of the protruding portions 134B, respectively.

In the present embodiment, the number of the first circuit boards 160 is also changed to one correspondingly. The first circuit board 160 is located between the protruding portions 134A and 134B, and also overlaps the connection line between the protruding portions 134A and 134B. Similarly, the vertical projection of the inner surface S2 of the first circuit board 160 on the protruding portions 134A is located between the outer surfaces S1A of the protruding portions 134A and the body 132, and the vertical projection of the inner surface S2 of the first circuit board 160 on the protruding portions 134B is located between the outer surfaces S1B of the protruding portions 134B and the body 132, so as to achieve integrating the first circuit board 160 between the protruding portions 134A and 134B. As a result, the structural complexity is simplified while disposing the circuit board, and thinning design is facilitated for the display device 100C.

In addition, the number of the second circuit boards 170A and 170B is also changed to two correspondingly. The second circuit boards 170A and 170B can respectively extend from the protruding portions 134A and 134B to the first circuit board 160, so that the conductive patterns 136A and 136B on the protruding portions 134A and 134B can be electrically connected to the first circuit board 160. With this configuration, when there is a demand for increasing the number of the integrated circuit components in the display device 100C, the integrated circuit components such as the integrated circuit components 180A and 180B in FIG. 3 can be disposed on more than one protruding portion, respectively.

Figure 4:
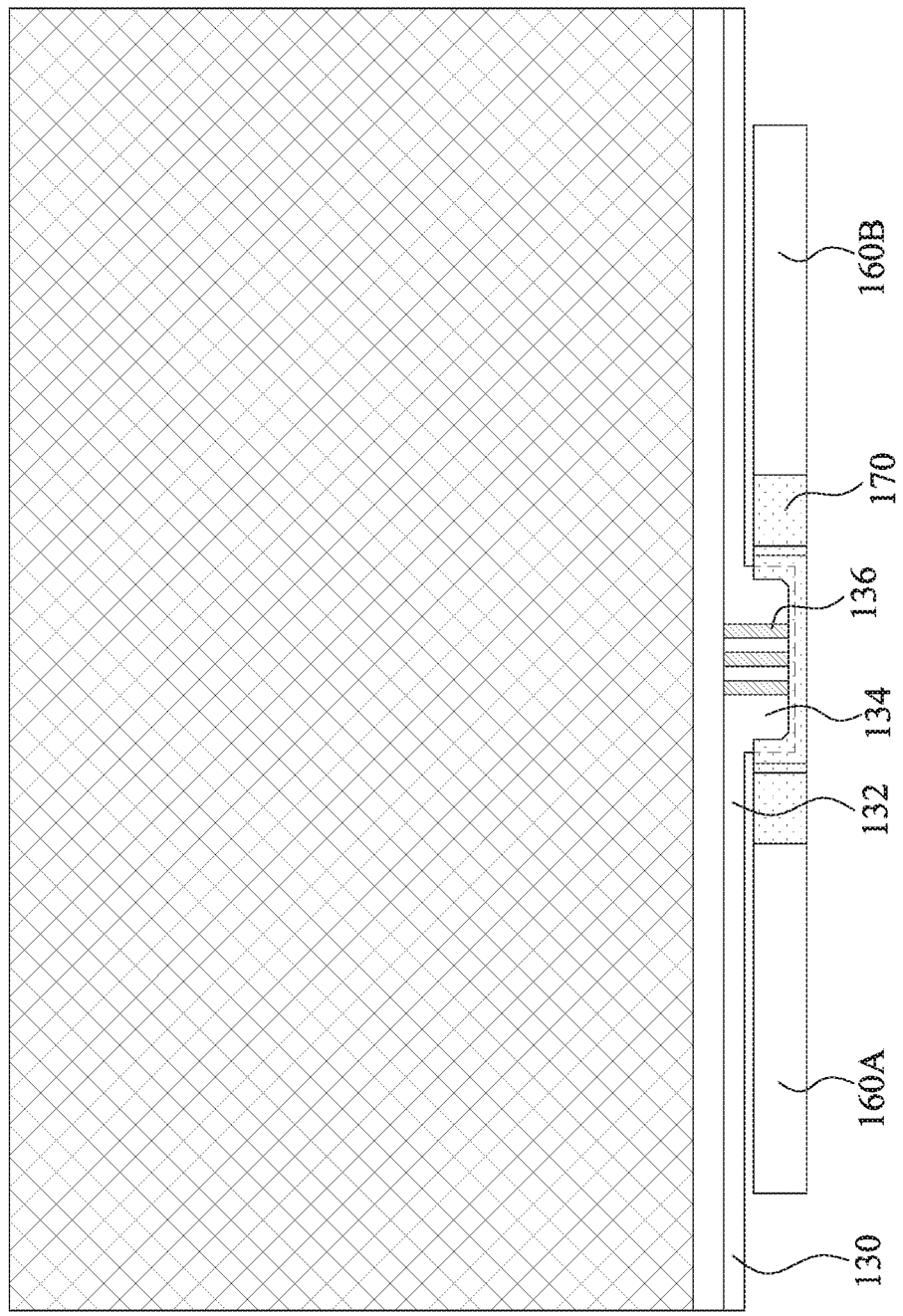
FIG. 4 illustrates a top view of a display device according to a fourth embodiment of the present disclosure.

Reference is made to FIG. 4. FIG. 4 illustrates a top view of a display device 100D according to a fourth embodiment of the present disclosure. At least one difference between the present embodiment and the first embodiment is that the integrated circuit component (e.g., the integrated circuit component 180 in FIG. 1A) disposed on the protruding portion 134 is omitted in the display device 100D of the present embodiment.

Specifically, in the present embodiment, the conductive pattern 136 disposed on the first transparent substrate 130 can continuously extend from the body 132 to the protruding portion 134. The conductive pattern 136 can be electrically connected to the layer body formed on the first transparent substrate 130 (e.g., the layer body 106 in FIG. 1B). In other words, the conductive pattern 136 (partial or all) on the protruding portion 134 may be an extension portion of the layer body 106 (as shown in FIG. 1B) formed on the first transparent substrate 130, such that the second circuit board 170 in contact with the conductive pattern 136 can be electrically connected to the layer body 106 directly through the conductive pattern 136.

Accordingly, the display device of the present disclosure includes the first transparent substrate, the first circuit board, and the second circuit board, in which the first transparent substrate includes the body and the protruding portion which are connected to each other. The protruding portion may be formed by cutting off the redundant area of the first transparent substrate. The first circuit board can be disposed on at least one side of the protruding portion, and the second circuit board can extend from the protruding portion to the first circuit board. Since the first circuit board can be disposed on at least one side of the protruding portion, the arrangement relationship between the first circuit board and the first transparent substrate can be tighter so as to increase the screen-to-body ratio of the display device and facilitate designing the display device with narrow bezel. Furthermore, by directly disposing the first circuit board on one side of the protruding portion, it facilitates simplifying the structural complexity while disposing the circuit board. For example, the circuit board does not have to be folded back, so as to facilitate thinning design for the display device and disposing other components on the display device.

While various embodiments of the present invention have been described above, it should be understood that they have been presented by way of example only, and not limitation. Numerous changes to the disclosed embodiments may be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A display device comprising:
   a first transparent substrate comprising a body and at least one protruding portion which are connected to each other, wherein the protruding portion has an outer surface, and the outer surface faces away from the body;
   a conductive pattern disposed on the first transparent substrate;
   at least one first circuit board adjacent to the protruding portion and located on the same side of the body in conjunction with the protruding portion, wherein the first circuit board has an inner surface facing the body, and a vertical projection of the inner surface on the protruding portion is located between the outer surface and the body;
   a second circuit board disposed on the protruding portion and extending to the first circuit board; and
   a thin film transistor array disposed on the body and electrically connected to the first circuit board, wherein the thin film transistor array is electrically connected to the first circuit board at least through the conductive pattern and the second circuit board.

2. The display device of claim 1, wherein the protruding portion has a first side surface, the first circuit board has a second side surface, and the first side surface and the second side surfaces face each other.

3. The display device of claim 1, further comprising a connector disposed on a lower surface of the first circuit board, wherein the lower surface of the first circuit board is located between the second circuit board and the connector.

4. The display device of claim 3, further comprising a backlight module, wherein the first transparent substrate is disposed on the backlight module, the connector and the backlight module are together located on the same side of the first transparent substrate, and each of the connector and the backlight module has a surface facing each other.

5. The display device of claim 1, wherein the protruding portion has a first upper surface, the first circuit board has a second upper surface, the first upper surface and the second upper surface face the second circuit board and are together located on a lower side of the second circuit board, and a position of the second upper surface is higher than a position of the first upper surface.

6. The display device of claim 1, wherein the inner surface of the first circuit board is separated from the body by a gap.

7. The display device of claim 1, further comprising:
   an integrated circuit component disposed on the protruding portion and electrically connected to the second circuit board via the conductive pattern,
   wherein the integrated circuit component is electrically connected to the thin film transistor array at least through the conductive pattern.

8. The display device of claim 1, wherein the number of the protruding portions is at least two, and the first circuit board is located between the protruding portions.

9. The display device of claim 8, wherein the display device further comprises a plurality of integrated circuit components disposed on the protruding portions, respectively.

10. The display device of claim 1, wherein the number of the first circuit boards is at least two, and the protruding portion is located between the first circuit boards.

11. The display device of claim 1, wherein the conductive pattern is continuously extended from the body to the protruding portion, and the second circuit board contacts the conductive pattern.

12. The display device of claim 1, further comprising:
   a second transparent substrate disposed on the first transparent substrate; and
   a display medium layer disposed between the first transparent substrate and the second transparent substrate in conjunction with the thin film transistor array.

* * * * *